United States Patent
Imai et al.

(10) Patent No.: US 8,869,213 B2
(45) Date of Patent: Oct. 21, 2014

(54) RECEPTION DEVICE

(75) Inventors: Tadashi Imai, Chiba (JP); Takayuki Kaida, Tokyo (JP); Kunihiko Morozumi, Tokyo (JP); Katsuki Hirabayashi, Tokyo (JP); Hitoshi Masumura, Kanagawa (JP)

(73) Assignee: Sony Corporation, Tokyo (JP)

( * ) Notice: Subject to any disclaimer, the term of this patent is extended or adjusted under 35 U.S.C. 154(b) by 325 days.

(21) Appl. No.: 13/053,460

(22) Filed: Mar. 22, 2011

(65) Prior Publication Data

US 2011/0247041 A1 Oct. 6, 2011

(30) Foreign Application Priority Data

Mar. 30, 2010 (JP) .................. 2010-077013

(51) Int. Cl.
 *H04N 7/20* (2006.01)
 *H04N 5/50* (2006.01)
 *H03J 1/00* (2006.01)

(52) U.S. Cl.
 CPC ............... *H04N 7/20* (2013.01); *H03J 1/0083* (2013.01)
 USPC ........................................... 725/68; 348/731

(58) Field of Classification Search
 None
 See application file for complete search history.

(56) References Cited

U.S. PATENT DOCUMENTS

| | | | |
|---|---|---|---|
| 7,271,640 B2* | 9/2007 | Bargroff ....................... | 327/356 |
| 2002/0160739 A1* | 10/2002 | Ozeki et al. ................... | 455/313 |
| 2005/0177854 A1* | 8/2005 | Suematsu et al. .............. | 725/81 |
| 2006/0174283 A1* | 8/2006 | Ieshima ........................ | 725/68 |
| 2006/0208832 A1* | 9/2006 | Kamata et al. ................ | 333/174 |
| 2007/0081610 A1* | 4/2007 | Krivokapic et al. .......... | 375/302 |
| 2007/0094695 A1* | 4/2007 | Naka ............................. | 725/100 |
| 2008/0120655 A1* | 5/2008 | Guzman et al. ................ | 725/70 |
| 2008/0211560 A1* | 9/2008 | Lam ............................... | 327/291 |
| 2008/0295137 A1* | 11/2008 | Chen .............................. | 725/70 |
| 2009/0055870 A1 | 2/2009 | Horibe | |
| 2010/0097531 A1* | 4/2010 | Miura et al. .................. | 348/735 |

FOREIGN PATENT DOCUMENTS

| | | |
|---|---|---|
| JP | 2007-116358 A | 5/2007 |
| JP | 2007-124290 A | 5/2007 |
| WO | WO 2006/109477 A1 | 10/2006 |

* cited by examiner

*Primary Examiner* — Jason K Lin

(74) *Attorney, Agent, or Firm* — Wolf, Greenfield & Sacks, P.C.

(57) ABSTRACT

A reception device includes a first input terminal receiving a first television broadcast signal of a first frequency band or a mixed wave of the first television broadcast signal and a second television broadcast signal of a second frequency band; a second input terminal receiving the second television broadcast signal; first and second tuner; a matching unit extracting a second broadcast signal from a broadcast signal received from a first circuit terminal and outputting the extracted second broadcast signal from a second circuit terminal; a first connection portion selectively performing a connection between the first input terminal and the first circuit terminal of the matching unit; and a second connection portion setting an input path of the second television broadcast signal to the second tuner to a path from the second input terminal or a path from the second circuit terminal of the matching unit.

20 Claims, 8 Drawing Sheets

RECEPTION DEVICE

BACKGROUND OF THE INVENTION

1. Field of the Invention

The present invention relates to a reception device for forming a front end module capable of receiving, for example, a plurality of television broadcast signals such as a satellite television broadcast and a terrestrial television broadcast.

2. Description of the Related Art

Recently, as satellite television broadcasting has been diffused, the number of reception devices capable of receiving not only a terrestrial television broadcast but also a satellite television broadcast is increased (for example, see Japanese Unexamined Patent Application Publication No. 2007-116358 and International Publication No. WO 2006-109477).

FIGS. 1A and 1B are diagrams showing a configuration example of a general receiver of a terrestrial television broadcast and a satellite television broadcast.

The receiver 1 of FIG. 1A includes a satellite television broadcast/terrestrial television broadcast reception tuner integration reception device 2, a satellite television broadcast antenna 3, and a terrestrial television broadcast antenna 4.

Hereinafter, the satellite television broadcast is referred to as a satellite broadcast and the terrestrial television broadcast is referred to as a terrestrial broadcast.

The reception device 2 includes a satellite tuner 21, a terrestrial tuner 22, a satellite broadcast antenna terminal 23 and a terrestrial broadcast antenna terminal 24.

The receiver 1A of FIG. 1B includes a satellite broadcast/terrestrial broadcast mixer 5 in addition to the configuration of FIG. 1A.

The reception device 2A includes a satellite tuner 21, a terrestrial tuner 22, a satellite broadcast/terrestrial broadcast common antenna terminal 25 and a frequency divider 26.

In general, in the receiver 1, it is necessary to connect the satellite broadcast reception satellite tuner 21 to the satellite broadcast antenna 3 and to connect the terrestrial broadcast reception terrestrial tuner 22 to the terrestrial broadcast antenna 4.

The satellite broadcast antenna 3 and the terrestrial broadcast antenna 4 are different antennas because they are different in terms of reception frequency.

The method of connecting the antennas 3 and 4 and the respective reception devices 2 include methods shown in FIGS. 1A and 1B.

In the method shown in FIG. 1A, the satellite broadcast antenna 3 and the terrestrial broadcast antenna 4 are individually connected using two cables CBL1 and CBL2. In the method shown in FIG. 1B, signals received by the satellite broadcast antenna 3 and the terrestrial broadcast antenna 4 are mixed by the mixer 5 and the mixed wave is electrically connected to one cable CBL3.

The terrestrial broadcast reception antenna 4 is installed in the receiver 1 of FIG. 1A. In the following case, the existing cable or equipment is used for terrestrial broadcast reception without change and a new wire is used for satellite broadcast reception.

If, in addition, the satellite broadcast antenna 3 is installed, if the frequency characteristics or the like of the existing cable or equipment does not cope with the satellite broadcast, or if it is not determined whether the frequency characteristics or the like of the existing cable or equipment is coping with the satellite broadcast, the existing cable or the like is used without change and a new wire is used for satellite broadcast reception.

That is, since a signal of 950 MHz to 2150 MHz is transmitted through the satellite cable and a signal of about 40 MHz to 864 MHz is transmitted through the terrestrial cable, for each the most suitable cable may be installed.

In this case, since the two satellite and terrestrial broadcast cables CBL1 and CBL2 are connected to the reception device 2, it is convenient that individual input terminals for each are formed on the reception device 2.

In the receiver 1A of FIG. 1B, the satellite broadcast signal and the terrestrial broadcast signal are transmitted through one cable using a difference in frequency between the transmitted signals.

In the receiver 1A, the mixer 5 for mixing the antenna signals and the frequency divider 26 for dividing the signals into the satellite tuner 21 and the terrestrial tuner 22 in the reception device 2A are necessary.

That is, upon installing the antennas, in the case where the satellite broadcast antenna 3 and the terrestrial broadcast antenna 4 are simultaneously installed, if both signals are mixed and electrically connected near the antennas, the number of wires connected to the reception device is only one. Thus, two cables may not be connected in the reception device.

In this case, since both signals are mixed and only one cable CBL3 is connected, it is convenient that both input terminals are combined to one input terminal in the reception device 2A.

If the number of input terminals is two in the case of FIG. 1B, it is necessary to divide the signal at the outside of the reception device using a separate frequency divider and connect the divided signals.

It may be difficult to minimize the receiver or to provide two connectors for connecting the antennas due to apparatus design constraints.

In this case, both input terminals may be combined into one input terminal in the receiver.

SUMMARY OF THE INVENTION

The input terminal of the reception device capable of receiving both broadcasts including the satellite broadcast and the terrestrial broadcast is formed as in the following two cases through various requirements.

In the first case, two terminals including an antenna terminal 23 for connecting the satellite broadcast antenna 3 and an antenna terminal 24 for connecting the terrestrial broadcast antenna 4 are individually formed.

In the second case, an antenna terminal for connecting the satellite broadcast antenna 3 and an antenna terminal for connecting the terrestrial broadcast antenna 4 are formed as one common antenna terminal.

As a result, as the reception device, in the case in which the number of input terminals is two and in the case in which the number of input terminal is one, it is necessary to design the input terminals as different tuner units.

To this end, since the types of tuner are increased, the number of necessary design processes is increased, the management cost of managing the types, and the number of tuners produced is decreased, it is necessary to develop a design with excellent efficiency.

In addition, even when the tuners are integrated into any one type, if the tuner unit including two input terminals is selected, it is necessary to provide a frequency divider outside the reception device when a signal is transmitted through one cable.

If the tuners are integrated into a tuner unit in which one input terminal is formed, when it is necessary to add the satellite broadcast antenna, it is necessary to simultaneously add the mixer.

It is desirable to provide a reception device capable of simply changing the number of input terminals of a first broadcast signal and a second broadcast signal to one or two and changing input specification choice using a simple method without adding a special part to the outside of a unit.

According to an embodiment of the present invention, there is provided a reception device including: a first input terminal configured to receive a first television broadcast signal of a first frequency band or a mixed wave of the first television broadcast signal and a second television broadcast signal of a second frequency band lower than the first frequency band of the first television broadcast signal; a second input terminal configured to receive the second television broadcast signal; a first tuner configured to perform at least a tuning process with respect to the first television broadcast signal received from the first input terminal; a second tuner configured to perform at least a tuning process with respect to the second television broadcast signal; a matching unit having a first circuit terminal and a second circuit terminal and configured to extract a second broadcast signal from a broadcast signal received from the first circuit terminal and to output the extracted second broadcast signal from the second circuit terminal; a first connection portion configured to selectively performs connection between the first input terminal and the first circuit terminal of the matching unit; and a second connection portion configured to set an input path of the second television broadcast signal to the second tuner to a path from the second input terminal or a path from the second circuit terminal of the matching unit.

According to the present invention, it is possible to simply change the number of input terminals of a first television broadcast signal and a second television broadcast signal to one or two and change input specification choice using a simple method without adding a special part to the outside of a unit.

DESCRIPTION OF THE PREFERRED EMBODIMENTS

Hereinafter, embodiments of the present invention will be described with reference to the accompanying drawings. In addition, description is given in the following order.

1. First Embodiment (First Configuration Example of Reception Device)

2. Second Embodiment (Second Configuration Example of Reception Device)

3. Third Embodiment (Third Configuration Example of Reception Device)

1. First Embodiment

Figure 1A:
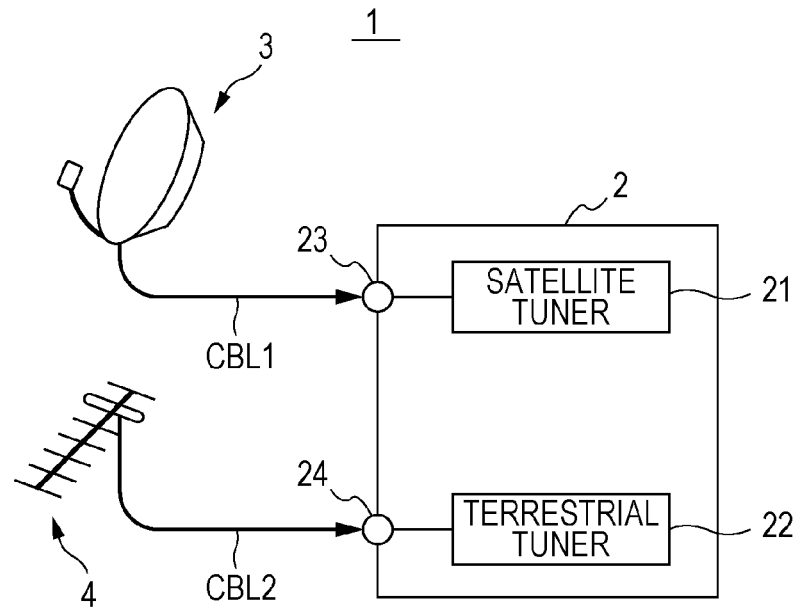
FIGS. 1A and 1B are diagrams showing a configuration example of a general receiver of a terrestrial television broadcast and a satellite television broadcast.
Figure 1B:
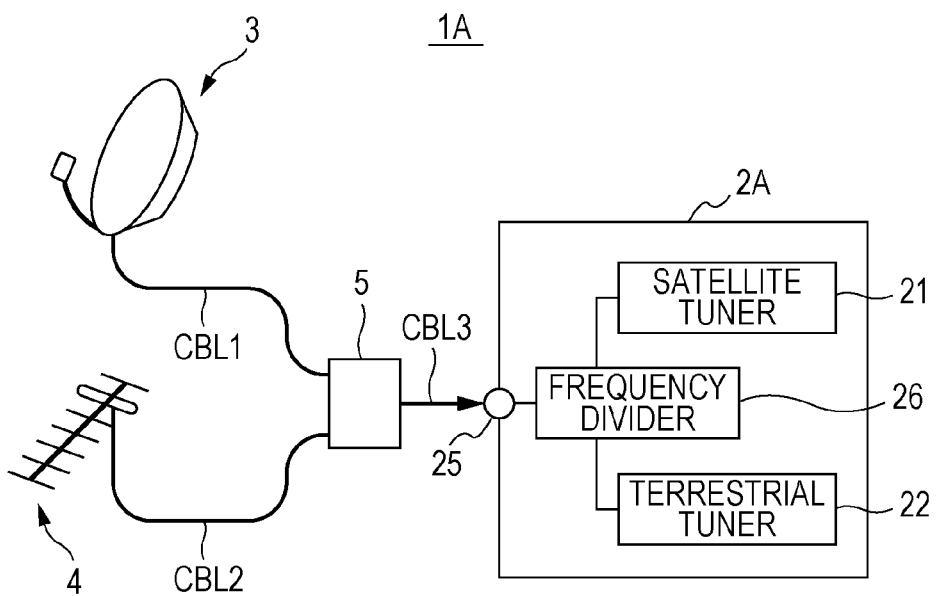
Figure 2:
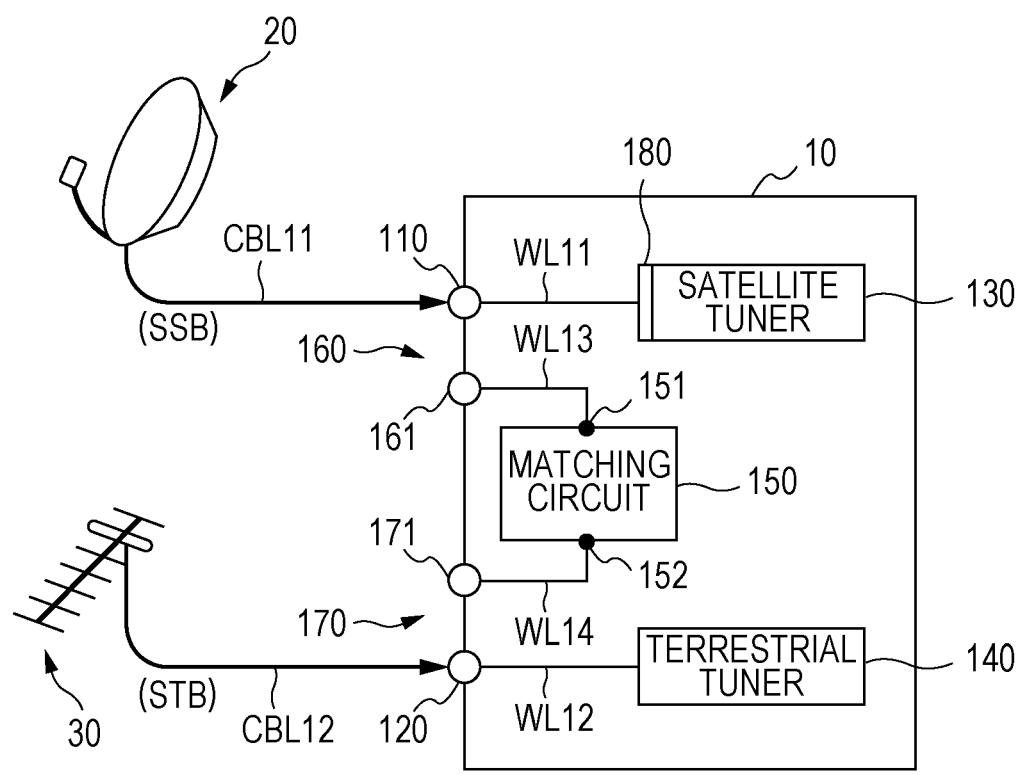
FIG. 2 is a diagram showing a configuration example of a broadcast signal reception device according to a first embodiment of the present invention in which the broadcast signal reception device functions as a 2-input module.
Figure 3:
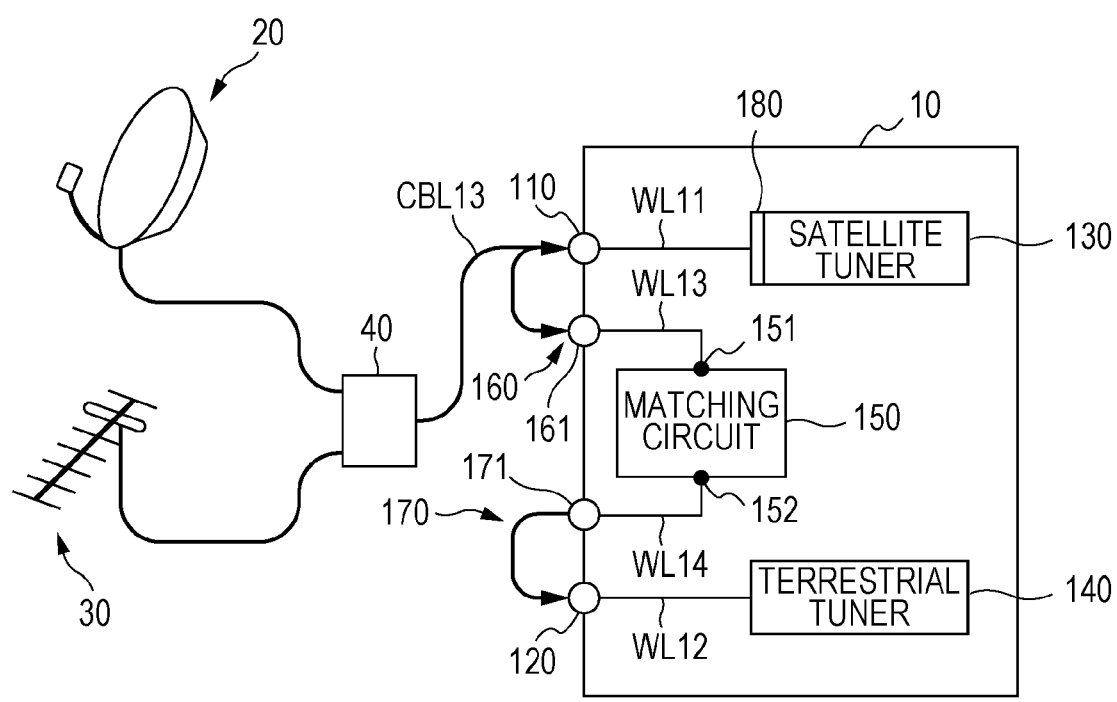
FIG. 3 is a diagram showing a configuration example of a broadcast signal reception device according to a first embodiment of the present invention in which the broadcast signal reception device functions as a 1-input module.

FIGS. 2 and 3 are diagrams showing configuration examples of a broadcast signal reception device according to a first embodiment of the present invention.

FIG. 2 shows a configuration example in which the broadcast signal reception device according to the first embodiment functions as a 2-input module.

FIG. 3 shows a configuration example in which the broadcast signal reception device according to the first embodiment functions as a 1-input module.

This reception device 10 is a front end module which is configured to receive a satellite television broadcast signal and a terrestrial television broadcast signal.

Here, for example, the satellite television broadcast signal corresponds to a first television broadcast signal and a first frequency band thereof is about 950 MHz to 2150 MHz.

The terrestrial television broadcast signal corresponds to a second television broadcast signal and a second frequency band thereof is lower than the first frequency band and is about 40 MHz to 864 MHz.

Hereinafter, the satellite television broadcast signal is referred to as a satellite broadcast signal (SSB) and the terrestrial television broadcast signal is referred to as a terrestrial broadcast signal (STB).

This reception device 10 functions as a 2-input module to which a satellite broadcast antenna 20 and a terrestrial broadcast antenna 30 are connected by individual cables CBL11 and CBL12, as shown in FIG. 2.

This reception device 10 functions as a 1-input module to which a mixer 40 for mixing broadcast signals received by the satellite broadcast antenna 20 and the terrestrial broadcast antenna 30 is connected by one cable CBL13, as shown in FIG. 3.

The reception device 10 includes a satellite broadcast antenna terminal 110 as a first input terminal, a terrestrial broadcast antenna terminal 120 as a second input terminal, a satellite tuner 130 as a first tuner and a terrestrial tuner 140 as a second tuner.

The reception device 10 includes a matching circuit (matching portion) 150, a first connection portion 160 and a second connection portion 170.

The reception device 10 includes an input filter portion 180 for extracting and supplying a signal of a frequency band of a satellite broadcast signal to the satellite tuner 130 at an input side of the satellite tuner 130.

In the reception device 10, the satellite broadcast antenna terminal 110, the terrestrial broadcast antenna terminal 120, the satellite tuner 130, the terrestrial tuner 140, the matching circuit 150, the first connection portion 160, the second connection portion 170 and the input filter portion 180 are formed as one semiconductor integrated circuit.

The satellite broadcast antenna terminal 110 as the first input terminal receives the satellite broadcast signal received by the satellite broadcast antenna 20 through the cable CBL11 if the reception device functions as the 2-input module as shown in FIG. 2.

The satellite broadcast antenna terminal 110 receives the mixed wave of the satellite broadcast signal and the terrestrial broadcast signal mixed by the mixer 40 through the cable CBL13 if the reception device functions as the 1-input module as shown in FIG. 3.

The satellite broadcast antenna terminal 110 is basically connected to an input portion of the satellite tuner 130 by a wire WL11.

In addition, in the present embodiment, the input filter portion 180 is connected to the wire WL11.

The terrestrial broadcast antenna terminal 120 as the second input terminal receives the terrestrial broadcast signal received by the terrestrial broadcast antenna 30 through the cable CBL12 if the reception device functions as the 2-input module as shown in FIG. 2.

The terrestrial broadcast antenna terminal 120 receives the terrestrial broadcast signal extracted by the matching circuit 150 through the second connection portion 170 if the reception device functions as the 1-input module as shown in FIG. 3.

The terrestrial broadcast antenna terminal 120 is basically connected to an input portion of the terrestrial tuner 140 by a wire WL12.

The satellite tuner 130 as the first tuner serves to perform a tuning process (broadcast signal acquisition process) including frequency conversion with respect to the satellite broadcast signal received from the satellite broadcast antenna terminal 110 and to perform a demodulation process of a video signal and an audio signal thereof.

Figure 4:
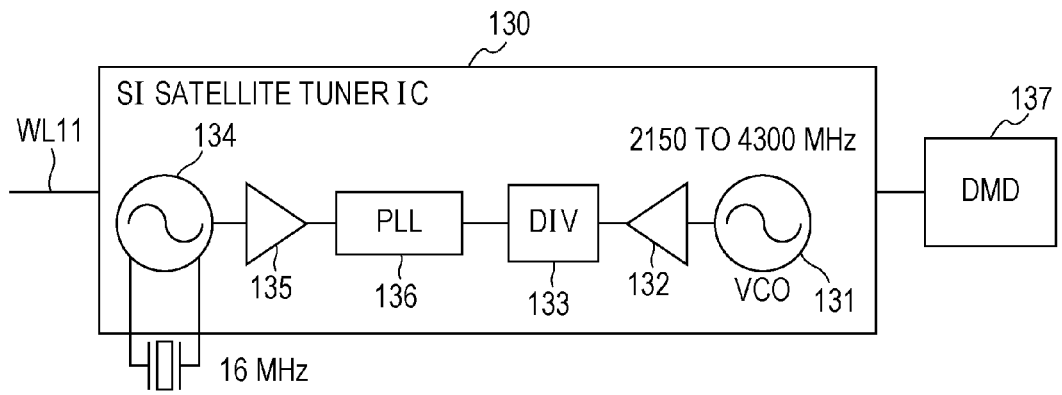
FIG. 4 is a diagram showing a configuration example of a frequency conversion unit of a satellite tuner according to the present embodiment.

FIG. 4 is a diagram showing a configuration example of a frequency conversion unit of the satellite tuner according to the present embodiment.

The satellite tuner 130 of FIG. 4 includes a local oscillator 131 including a voltage control oscillator (VCO) for oscillating, for example, a local oscillation signal of a frequency of 2150 MHz to 4300 MHz, a buffer 132 and a frequency divider 133.

The satellite tuner 130 includes a crystal oscillator 134 for oscillating, for example, a reference clock of a frequency of 16 MHz, a buffer 135 and a PLL circuit 136. The PLL circuit 136 supplies a clock signal in which the local oscillation signal frequency divided by the frequency divider 133 is phase synchronized with the reference clock signal to a mixer (not shown).

In the satellite tuner 130, a demodulation circuit (DMD) 137 is provided on the output side of the frequency conversion unit.

The terrestrial tuner 140 as the second tuner serves to perform a tuning process (broadcast signal acquisition process) including frequency conversion with respect to the terrestrial broadcast signal received through the terrestrial broadcast antenna terminal 120 and to perform a demodulation process of a video signal and an audio signal thereof.

Figure 5:
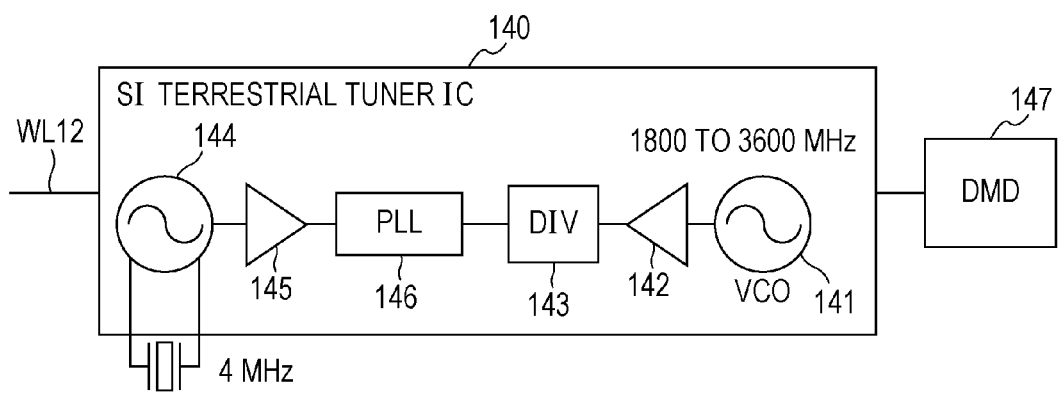
FIG. 5 is a diagram showing a configuration example of a frequency conversion unit of a terrestrial tuner according to the present embodiment.

FIG. 5 is a diagram showing a configuration example of a frequency conversion unit of the terrestrial tuner according to the present embodiment.

The terrestrial tuner 140 includes a local oscillator 141 including a voltage control oscillator (VCO) for oscillating, for example, a local oscillation signal of a frequency of 1800 MHz to 3600 MHz, a buffer 142 and a frequency divider 143.

The terrestrial tuner 140 includes a crystal oscillator 144 for oscillating, for example, a reference clock of a frequency of 4 MHz, a buffer 145 and a PLL circuit 146.

The PLL circuit 146 supplies a clock signal in which the local oscillation signal frequency divided by the frequency divider 143 is phase synchronized with the reference clock signal to a mixer (not shown).

In the satellite tuner 140, a demodulation circuit (DMD) 147 is provided on the output side of the frequency conversion unit.

The matching circuit 150 includes a first circuit terminal 151 and a second circuit terminal 152.

The matching circuit 150 extracts the terrestrial broadcast signal from the broadcast signal received from the first circuit terminal 151, for example, the mixed signal of the satellite broadcast signal and the terrestrial broadcast signal and outputs the extracted terrestrial broadcast signal STB from the second circuit terminal 152 to the second connection portion 170.

The matching circuit 150 includes a low-pass filter (LPF).

The first connection portion 160 may selectively connect the satellite broadcast antenna terminal 110 as the first input terminal and the first circuit terminal 151 of the matching circuit 150.

The second connection portion 170 sets the input path of the terrestrial broadcast signal to the terrestrial tuner 140 to a path of the terrestrial broadcast antenna terminal 120 as the second input terminal or a path from the second circuit terminal 152 of the matching circuit 150.

In the first embodiment, the first connection portion 160 and the second connection portion 170 are configured as follows.

In the first embodiment, the first connection portion 160 includes a first connection terminal 161 formed to be paired with and connected to the satellite broadcast antenna terminal 110 as the first input terminal.

The first connection terminal 161 is connected to the first circuit terminal 151 of the matching circuit 150 by a wire WL13.

In the first connection portion 160, as shown in FIG. 2, if the reception device functions as the 2-input module, the non-connection state between the first connection terminal 161 and the satellite broadcast antenna terminal 110 is held.

In the first connection portion 160, as shown in FIG. 3, if the reception device functions as the 1-input module, the connection state between the first connection terminal 161 and the satellite broadcast antenna terminal 110 is held.

In the first embodiment, the second connection portion 170 includes a second connection terminal 171 formed to be paired with and connected to the terrestrial broadcast antenna terminal 120 as the second input terminal.

The second connection terminal 171 is connected to the second circuit terminal 152 of the matching circuit 150 by a wire WL14.

In the second connection portion 170, as shown in FIG. 2, if the reception device functions as the 2-input module, the non-connection state between the second connection terminal 171 and the terrestrial broadcast antenna terminal 120 is held.

In the second connection portion 170, as shown in FIG. 3, if the reception device functions as the 1-input module, the connection state between the second connection terminal 171 and the terrestrial broadcast antenna terminal 120 is held.

The reception device 10 includes the input filter portion 180 for extracting the signal of the frequency band of the satellite broadcast signal to the satellite tuner 130 at the input side of the satellite tuner 130, as described above.

Figure 6:
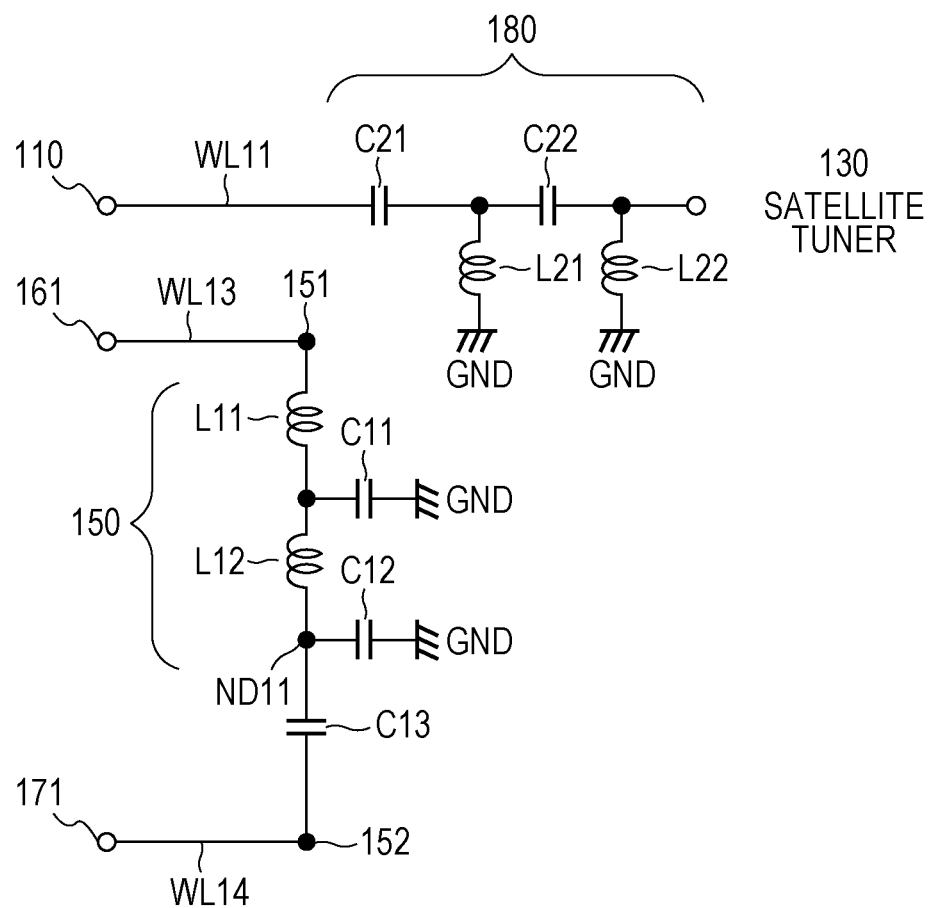
FIG. 6 is a circuit diagram showing a configuration example of a matching circuit and an input filter portion according to the present embodiment.

FIG. 6 is a circuit diagram showing a configuration example of the matching circuit and the input filter portion according to the present embodiment.

In FIG. 6, the satellite broadcast antenna terminal 110, the first connection terminal 161 of the first connection portion 160, the second connection terminal 171 of the second connection portion 170, and the matching circuit 150 are included and, among them, the detailed configuration of the matching circuit 150 is shown.

FIG. 6 shows the detailed configuration of the input filter portion 180.

The matching circuit 150 of FIG. 6 includes inductors L11 and L12 and capacitors C11, C12 and C13. The input filter portion 180 of FIG. 6 includes capacitors C21 and C22 and inductors L21 and L22.

The matching circuit 150 is an example of 2-stage low-pass filter in which the shape of a low-pass filter grounded at the capacitor C11 through the inductor L11 connected to the first connection terminal 161 in series is similarly configured in a combination of the inductor L12 and the capacitor C12.

The capacitor C13 provided between a final node ND11 and the second connection terminal 171 is connected for cutting a DC component between the first connection terminal 161 and the second connection terminal 171.

The input filter portion 180 provided at the input side of the satellite tuner 130 from the satellite broadcast antenna terminal 110 includes a high-pass filter (HPF) because the band of the satellite broadcast signal is higher than the band of the terrestrial broadcast signal in terms of frequency.

That is, a 2-stage high-pass filter is configured in which the shape of the high-pass filter grounded at the inductor L21 through the capacitor C21 connected in series is similarly configured in a combination of the capacitor C22 and the inductor L22.

The reception device 10 extracts the satellite broadcast signal and the terrestrial broadcast signal by the frequency division effect of the high-pass filter and the low-pass filter.

In the first embodiment, as shown in FIG. 2, the reception device functions as the 2-input module in the non-connection state between the satellite broadcast antenna terminal 110 and the first connection terminal 161 and the non-connection state between the terrestrial broadcast antenna terminal 120 and the second connection terminal 171.

In this case, the satellite broadcast antenna 20 and the terrestrial broadcast antenna 30 are connected by the individual cables CBL11 and CBL12 such that the received signals are transmitted by the two cables CBL11 and CBL12 so as to be input to the reception device 10.

Since the satellite broadcast antenna terminal 110 and the first connection terminal 161 are in the non-connection state and the terrestrial broadcast antenna terminal 120 and the second connection terminal 171 are in the non-connection state, the matching circuit 150 does not perform any function.

Accordingly, the satellite broadcast signal received from the satellite broadcast antenna terminal 110 is directly input to the satellite tuner 130 such that the process of acquiring and demodulating the satellite broadcast signal is performed in the satellite tuner 130.

Similarly, the terrestrial broadcast signal received from the terrestrial broadcast antenna terminal 120 is directly input to the terrestrial tuner 140 such that the process of acquiring and demodulating the terrestrial broadcast signal is performed in the terrestrial tuner 140.

As shown in FIG. 3, in the case of multi-transmission of the satellite wave and the terrestrial wave using one cable CBL13, the first connection terminal 161 is connected to the satellite broadcast antenna terminal 110 and the second connection terminal 171 is connected to the terrestrial broadcast antenna terminal 120.

In this case, when viewed from the side of the satellite broadcast antenna terminal 110 to the side of the terrestrial broadcast antenna terminal 120, as described above, the matching circuit 150 is configured to perform the function of the low-pass filter so as to obtain the same effect as the case of installing a frequency division circuit therein.

The internal configuration of the reception device 10 which is the satellite broadcast/terrestrial broadcast reception integration tuner is completely the same and a use application may be freely changed to suit the specifications of the set apparatus.

2. Second Embodiment

Figure 7:
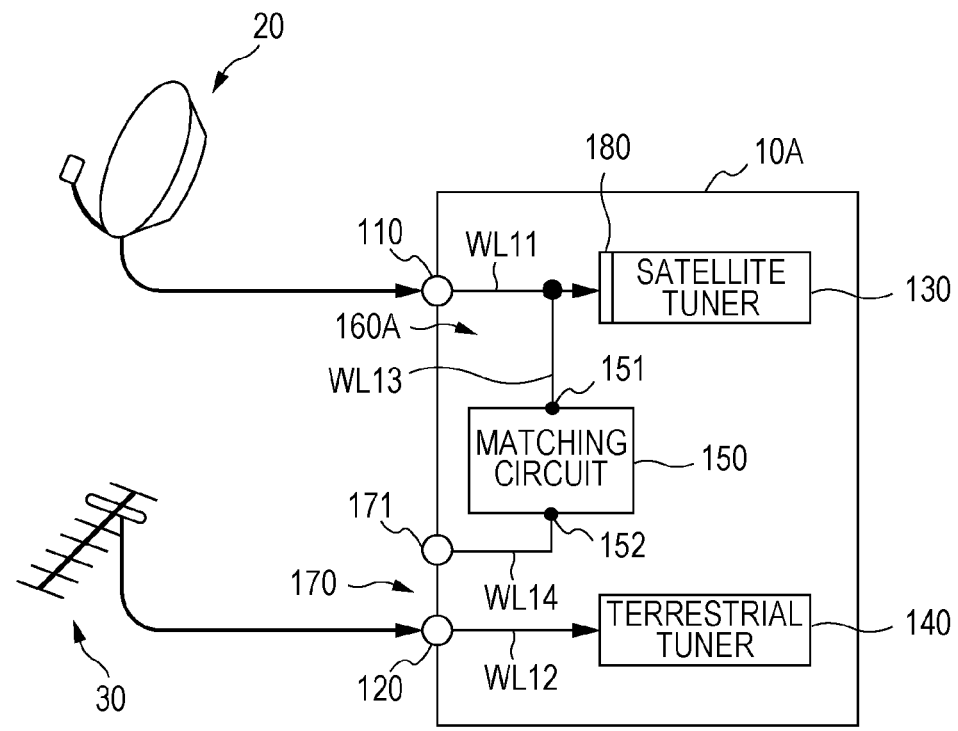
FIG. 7 is a diagram showing a configuration example of a broadcast signal reception device according to a second embodiment of the present invention in which the broadcast signal reception device functions as a 2-input module.
Figure 8:
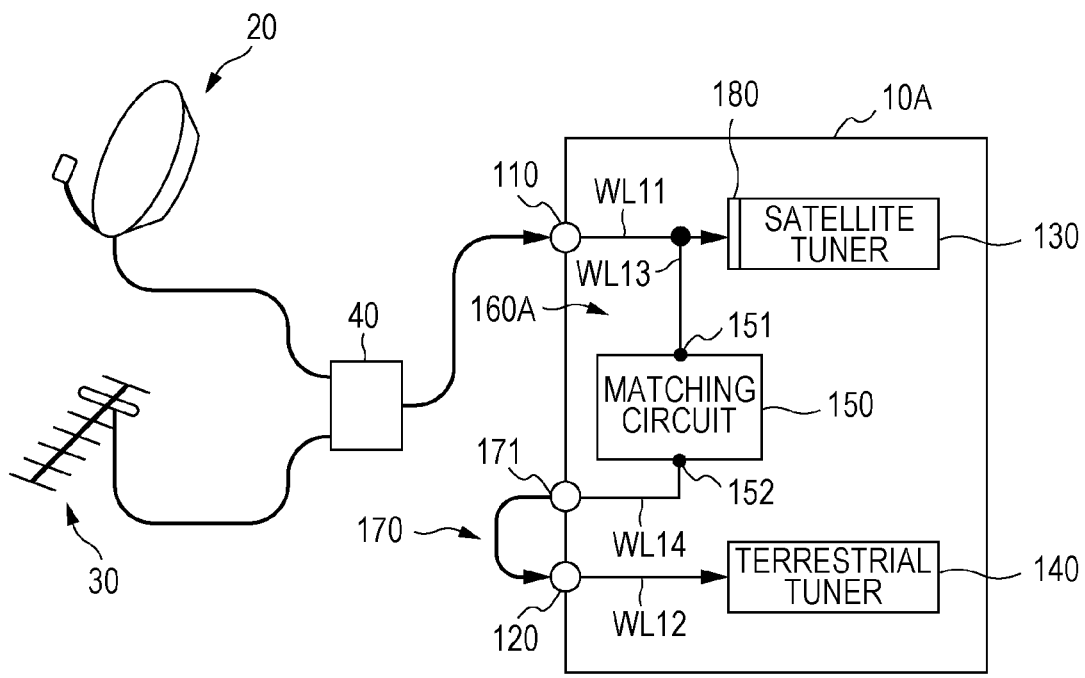
FIG. 8 is a diagram showing a configuration example of a broadcast signal reception device according to a second embodiment of the present invention in which the broadcast signal reception device functions as a 1-input module.

FIGS. 7 and 8 are diagrams showing configuration examples of a broadcast signal reception device according to a second embodiment of the present invention.

FIG. 7 shows a configuration example in which the broadcast signal reception device according to the second embodiment functions as a 2-input module.

FIG. 8 shows a configuration example in which the broadcast signal reception device according to the second embodiment functions as a 1-input module.

The reception device 10A according to the second embodiment is different from the reception device 10 according to the above-described first embodiment in the configuration of the first connection portion 160A. In the first connection portion 160A of the reception device 10A according to the second embodiment, the satellite broadcast antenna terminal 110 as the first input terminal and the first circuit terminal 151 of the matching circuit 150 are directly connected by a wire WL13 without forming the first connection terminal.

In this case, since the first circuit terminal 151 which is one end of the matching circuit 150 is generally connected to the satellite broadcast antenna terminal 110, it is possible to realize a simpler configuration in the case where, for example, the matching circuit is a 2-terminal circuit with very simple inductance in series.

The other configuration is equal to that of the first embodiment.

In the second embodiment, as shown in FIG. 7, the reception device functions as the 2-input module in the connection state between the satellite broadcast antenna terminal 110 and the first circuit terminal 151 and the non-connection state between the terrestrial broadcast antenna terminal 120 and the second connection terminal 171.

In this case, the satellite broadcast antenna 20 and the terrestrial broadcast antenna 30 are connected by the individual cables CBL11 and CBL12 such that the received signals are transmitted by the two cables CBL11 and CBL12 so as to be input to the reception device 10A.

Since the terrestrial broadcast antenna terminal 120 and the second connection terminal 171 are in the non-connection state, the output of the matching circuit 150 does not cause any function.

Accordingly, the satellite broadcast signal received from the satellite broadcast antenna terminal 110 is directly input to the satellite tuner 130 such that the process of acquiring and demodulating the satellite broadcast signal is performed in the satellite tuner 130.

Similarly, the terrestrial broadcast signal received from the terrestrial broadcast antenna terminal 120 is directly input to the terrestrial tuner 140 such that the process of acquiring and demodulating the terrestrial broadcast signal is performed in the terrestrial tuner 140.

As shown in FIG. 8, in the case of multi-transmission of the satellite wave and the terrestrial wave using one cable CBL13, the first circuit terminal 151 is directly connected to the satellite broadcast antenna terminal 110 and the second connection terminal 171 is connected to the terrestrial broadcast antenna terminal 120.

In this case, when viewed from the side of the satellite broadcast antenna terminal 110 to the side of the terrestrial broadcast antenna terminal 120, as described above, the matching circuit 150 is configured to perform the function of the low-pass filter so as to obtain the same effect as the case of installing a frequency division circuit therein.

The internal configuration of the reception device 10 which is the satellite broadcast/terrestrial broadcast reception integration tuner is completely the same and a use application may be freely changed to suit the specifications of the set apparatus.

3. Third Embodiment

Figure 9:
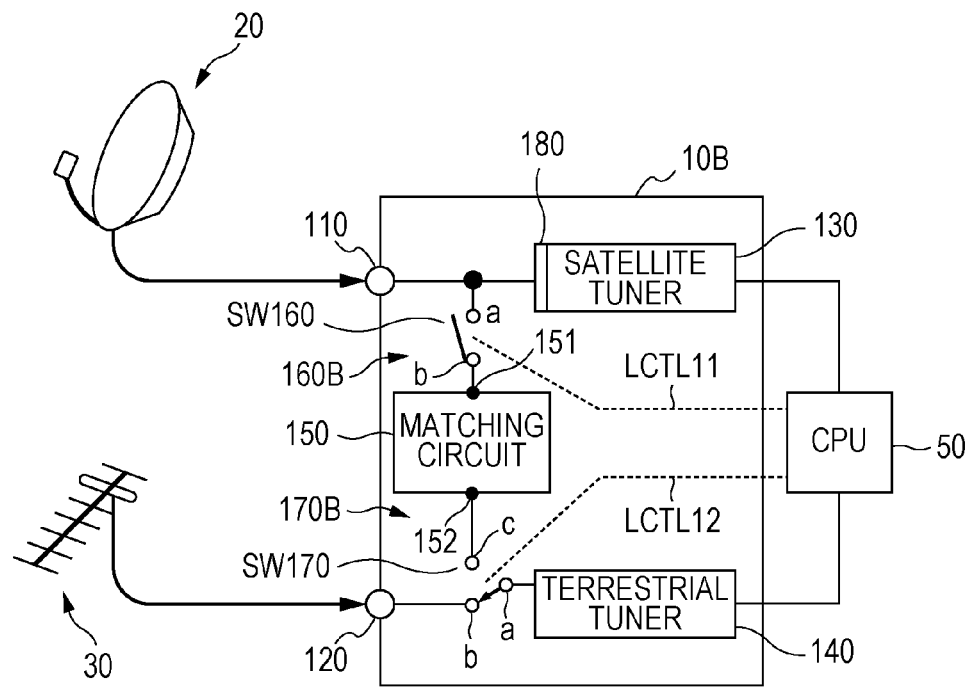
FIG. 9 is a diagram showing a configuration example of a broadcast signal reception device according to a third embodiment of the present invention in which the broadcast signal reception device functions as a 2-input module.
Figure 10:
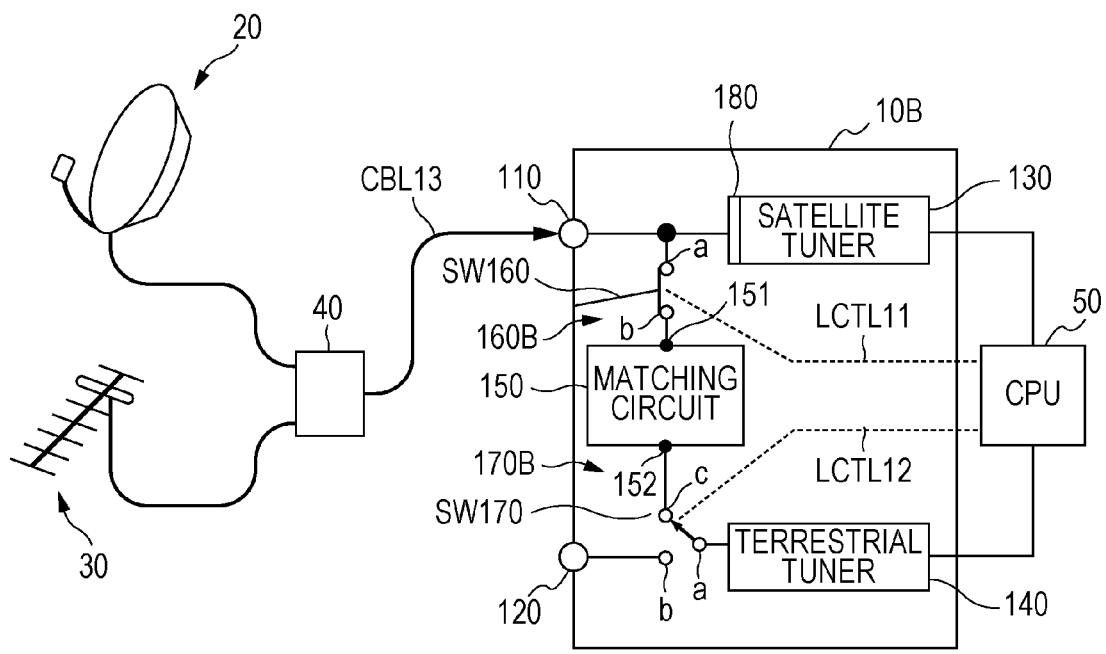
FIG. 10 is a diagram showing a configuration example of a broadcast signal reception device according to a third embodiment of the present invention in which the broadcast signal reception device functions as a 1-input module.

FIGS. 9 and 10 are diagrams showing configuration examples of a broadcast signal reception device according to a third embodiment of the present invention.

FIG. 9 shows a configuration example in which the broadcast signal reception device according to the third embodiment functions as a 2-input module.

FIG. 10 shows a configuration example in which the broadcast signal reception device according to the third embodiment functions as a 1-input module.

The reception device 10B of the third embodiment is configured such that the switch of transmission paths of the broadcast signals of a first connection portion 160B and a second connection portion 170B is automatically performed under the control of a control unit (for example, CPU) 50.

In the third embodiment, the first connection portion 160B includes a first switch SW160 for switching the connection state and the non-connection state between the satellite broadcast antenna terminal 110 which is the first input terminal and the first circuit terminal 151 of the matching circuit 150.

In the first switch SW160, a terminal a is connected to a wire WL11 for connecting the satellite broadcast antenna terminal 110 and the input portion of the satellite tuner 130 and a terminal b is connected to the first circuit terminal 151 of the matching circuit 150.

The first switch SW160 is switched on (connection state) or off (non-connection state) under the control of the control unit 50.

The second connection portion 170B includes a second switch SW170 for switching the connection of the input portion of the terrestrial tuner 140 to the terrestrial broadcast antenna terminal 120 which is the second input terminal or to the second circuit terminal 152 of the matching circuit 150.

In the second switch SW170, a terminal a is connected to the input portion of the terrestrial tuner 140, a terminal b is connected to the terrestrial broadcast antenna terminal 120, a terminal c is connected to the second circuit terminal 152 of the matching circuit 150.

The second switch SW170 is switched such that the terminal a (the input portion of the terrestrial tuner) is connected to the terminal b (the terrestrial broadcast antenna terminal) or is connected to the second circuit terminal 152 of the matching circuit 150 under the control of the control unit 50.

The control unit 50 is connected to the satellite tuner 130 and the terrestrial tuner 140.

The control unit 50 controls the satellite tuner 130 and the terrestrial tuner 140 and monitors output the data thereof.

The control unit 50 may particularly identify a lock flag representing the demodulation circuits 137 and 147 of the tuners 130 and 140 which normally acquire and demodulate the signals and a bit error rate representing demodulation quality thereof.

In addition, in the control unit 50, control lines LCTL11 and LCTL12 are connected from ports for controlling the first switch SW160 and the second switch SW170 to the switches SW160 and SW170.

In the third embodiment, as shown in FIG. 9, the first switch SW160 is controlled to the off state and the second switch SW170 is connected such that the terminal a is connected to the terminal b, by the control unit 50.

At this time, the satellite broadcast antenna terminal 110 and the first circuit terminal 151 of the matching circuit 150 are in the non-connection state through the first switch SW160 and the input portion of the terrestrial tuner 140 is connected to the terrestrial broadcast antenna terminal 120 through the second switch SW170.

That is, the reception device 10B functions as a 2-input module.

In this case, the satellite broadcast antenna 20 and the terrestrial broadcast antenna 30 are connected by the individual cables CBL11 and CBL12 such that the received signals are transmitted by the two cables CBL11 and CBL12 so as to be input to the reception device 10B.

Since the terrestrial broadcast antenna terminal 120 and the second connection terminal 171 are in the non-connection state, the output of the matching circuit 150 does not cause any function.

Accordingly, the satellite broadcast signal received from the satellite broadcast antenna terminal 110 is directly input to the satellite tuner 130 such that the process of acquiring and demodulating the satellite broadcast signal is performed in the satellite tuner 130.

Similarly, the terrestrial broadcast signal received from the terrestrial broadcast antenna terminal 120 is directly input to the terrestrial tuner 140 such that the process of acquiring and demodulating the terrestrial broadcast signal is performed in the terrestrial tuner 140.

As shown in FIG. 10, in the case of multi-transmission of the satellite wave and the terrestrial wave using one cable CBL13, the first switch SW160 is controlled to the on state the second switch SW170 is in the connection state between the terminal a and the terminal c by the control unit 50.

At this time, the satellite broadcast antenna terminal 110 and the first circuit terminal 151 of the matching circuit 150 are connected by the first switch SW160 and the input portion of the terrestrial tuner 140 is connected to the second circuit terminal 152 of the matching circuit 150 by the second switch SW170.

That is, the reception device 10B functions as a 2-input module.

In this case, when viewed from the side of the satellite broadcast antenna terminal 110 to the side of the input unit of the terrestrial tuner 140, as described above, the matching circuit 150 is configured to perform the function of the low-pass filter so as to obtain the same effect as the case of installing a frequency division circuit therein.

The internal configuration of the reception device 10 which is the satellite broadcast/terrestrial broadcast reception integration tuner is completely the same and a use application may be freely changed to suit the specifications of the set apparatus.

In addition, for example, the control unit 50 formed by the CPU has a function for switching the first switch SW160 and the second switch SW170 so as to perform a 1-input module function and a 2-input module function and scanning the received signals so as to monitor and discern a reception state.

That is, the control unit 50 has a function for scanning the processed signals of the satellite tuner 130 and the terrestrial tuner 140 and monitoring the reception state of the satellite broadcast signal and the terrestrial broadcast signal.

In this case, the control unit 50 may scan the signals and monitor and discern the reception state of the signals by software used on the CPU.

Figure 11:
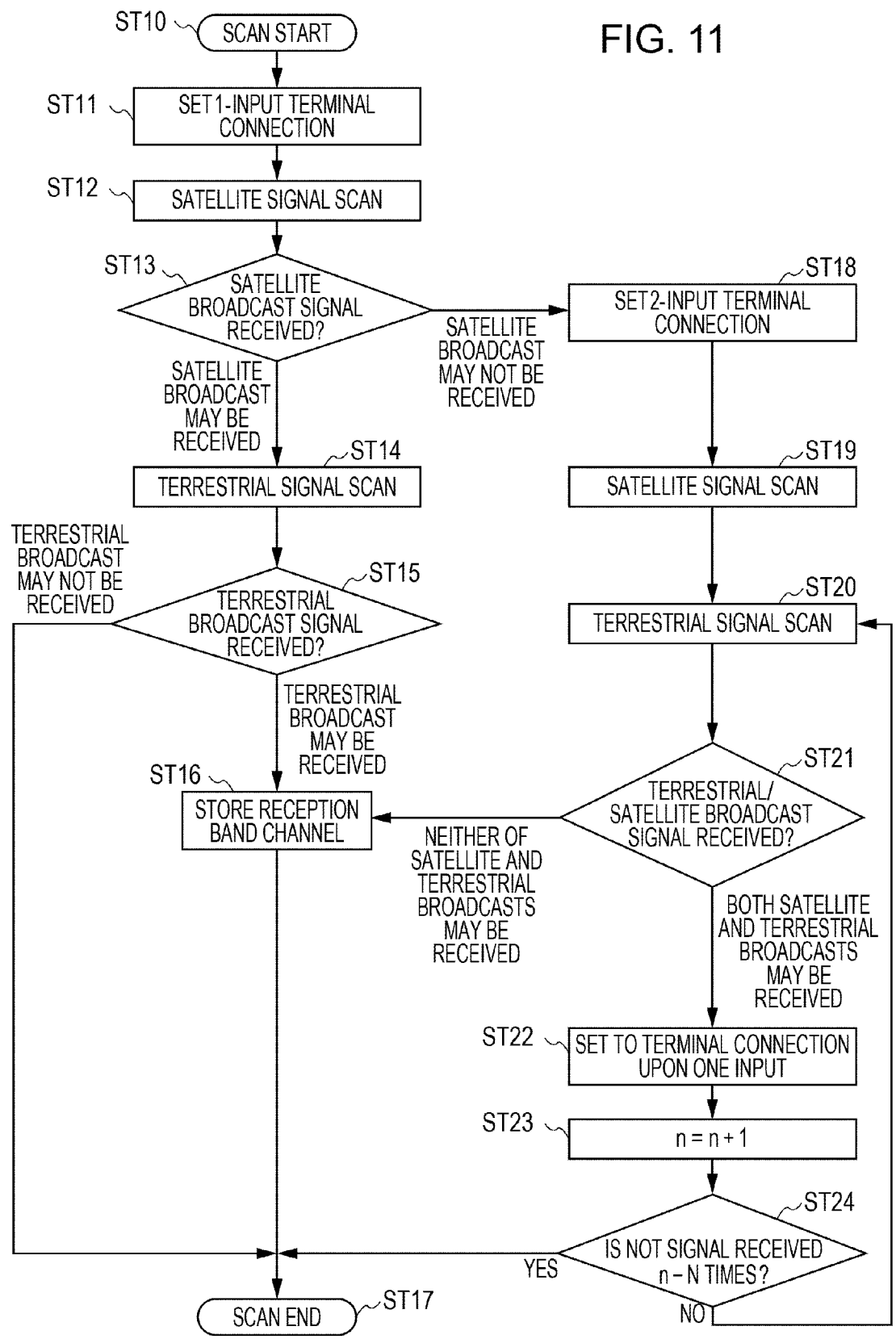
FIG. 11 is a flowchart illustrating an example of a process of monitoring and discerning a signal reception state according to the third embodiment.

FIG. 11 is a flowchart illustrating an example of a process of monitoring and discerning the signal reception state according to the third embodiment.

This process starts from a scan start of step ST10 and the control unit 50 sets a 1-input module function which is a 1-cable mode (ST11).

In step ST11, as shown in FIG. 10, by the control unit 50, the first switch SW160 is controlled to the on state and the second switch SW170 is controlled to the connection state between the terminal a and the terminal c.

The satellite broadcast antenna terminal 110 and the first circuit terminal 151 of the matching circuit 150 are connected by the first switch SW160 and the input portion of the terrestrial tuner 140 is connected to the second circuit terminal 152 of the matching circuit 150 by the second switch SW170.

In this state, the control unit 50 scans the signal (signal scan) of the satellite broadcast band (ST12) and determines whether or not a signal is present (ST13).

The above-described lock flag, bit error rate, or the like is used herein.

In step ST13, if the satellite broadcast signal is confirmed, the terrestrial signal scan is performed (ST14) and a determination as to whether or not a signal is present is made (ST15).

At this time, if the terrestrial broadcast reception is possible, reception band channel data is stored in a memory or the like (ST16) and a scan program is completed (ST17).

In contrast, if reception may not be performed in the determination of the reception of the satellite broadcast signal in step ST13, a 2-input module function which is a 2-cable mode is set (ST18).

In step ST18, as shown in FIG. 9, by the control unit 50, the first switch SW160 is controlled to the off state and the second switch SW170 is controlled to the connection state between the terminal a and the terminal b.

The satellite broadcast antenna terminal 110 and the first circuit terminal 151 of the matching circuit 150 is in the non-connection state through the first switch SW160 and the input portion of the terrestrial tuner 140 is connected to the terrestrial broadcast antenna terminal 120 through the second switch SW170.

In this state, the control unit 50 scans the signal of the satellite broadcast band (ST19) and then scans the terrestrial signal (ST20).

In step ST21, a determination as to which of the terrestrial or satellite broadcast signal may be received and, if any one of the signals may be received, the reception band channel is stored in step ST16 and then is completed.

If neither of the terrestrial and satellite broadcast signals is received in step ST21, 1-cable mode is returned (ST22) and the terrestrial signal scan of step ST20 is returned.

At this time, if the signal may not be received by a predetermined number of times through performing the counter processes of steps ST22 and ST23, the process proceeds to step ST17 and the scan process is forcibly completed.

As described above, according to the present embodiment, the following countermeasure is possible through the very simple change of an external circuit.

That is, the conversion of the case where two terminals, that is, the satellite broadcast antenna terminal and the terrestrial broadcast antenna terminal are individually provided and the case where the satellite broadcast antenna terminal and the terrestrial broadcast antenna terminal are formed as one common antenna terminal may be realized by the very simple connection of the external terminal of the module.

To this end, it is possible to design the configuration of the input terminal according various use forms.

Accordingly, since the types of modules used are reduced and efficiency of collective production is simultaneously realized, it is possible to reduce the costs of a final tuner module.

Since it is not necessary to install a part on a set substrate, it is possible to miniaturize the set substrate.

In addition, by configuring a system having an automatic discerning function shown in FIG. 11, it is possible automatically to cope even with a case where the number of signal lines is changed through user circumstances. Thus, a considerable effect is obtained upon assembly into a final set product.

The embodiments of the present invention may be realized not only in a circuit module in which a semiconductor and a discrete part are installed, but also in a semiconductor IC in which all parts are realized by semiconductors.

That is, a scale merit through the space saving effect through the use of the semiconductor and the integration of types is greater than the improvement of the module.

The present application contains subject matter related to that disclosed in Japanese Priority Patent Application JP 2010-077013 filed in the Japan Patent Office on Mar. 30, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A reception device comprising:
 a first input terminal configured to receive a first television broadcast signal of a first frequency band or a mixed wave of the first television broadcast signal and a second television broadcast signal of a second frequency band lower than the first frequency band;
 a second input terminal configured to receive the second television broadcast signal;
 a first tuner configured to perform at least a tuning process with respect to the first television broadcast signal received from the first input terminal;

a second tuner configured to perform at least a tuning process with respect to the second television broadcast signal;

a matching unit comprising a first circuit terminal and a second circuit terminal and configured to extract a second broadcast signal from a broadcast signal received from the first circuit terminal and to output the extracted second broadcast signal from the second circuit terminal;

a first connection portion configured to selectively perform a connection between the first input terminal and the first circuit terminal of the matching unit; and a second connection portion configured to selectively set an input path to the second tuner for the second television broadcast signal to a path bypassing the matching unit from the second input terminal in a first setting configuration and to a path from the second circuit terminal of the matching unit in a second setting configuration.

2. The reception device according to claim 1, wherein:
the first connection portion includes a first connection terminal formed to be paired with and connected to the first input terminal,
the first connection portion is connected to the first circuit terminal of the matching unit,
the second connection portion includes a second connection terminal formed to be paired with and connected to the second input terminal,
the second connection terminal is connected to the second circuit terminal of the matching unit,
an input portion of the first tuner is connected to the first input terminal, and
an input portion of the second tuner is connected to the second input terminal.

3. The reception device according to claim 2, wherein, if the first input terminal and the first connection terminal are in a non-connection state and the second input terminal and the second connection terminal are in a non-connection state, the reception device functions as a 2-input module in which a first television signal received from the first input terminal is input to the first tuner and a second television signal received from the second input terminal is input to the second tuner.

4. The reception device according to claim 2, wherein, if the first input terminal and the first connection terminal are in a connection state and the second input terminal and the second connection terminal are in a connection state, the reception device functions as a 1-input module to which a mixed wave of a first television signal and a second television signal received from the first input terminal is input.

5. The reception device according to claim 4, wherein a filter which passes and supplies the signal of the first frequency band to the first tuner is included at an input side of the first tuner.

6. The reception device according to claim 1, wherein:
the first connection portion is connected to the first input terminal and the first circuit terminal of the matching unit,
the second connection portion includes a connection terminal formed to be paired with and connected to the second input terminal,
the connection terminal is connected to the second circuit terminal of the matching unit,
an input portion of the first tuner is connected to the first input terminal, and
an input portion of the second tuner is connected to the second input terminal.

7. The reception device according to claim 6, wherein, if the second input terminal and the connection terminal are in a non-connection state, the reception device functions as a 2-input module in which a first television signal received from the first input terminal is input to the first tuner and a second television signal received from the second input terminal is input to the second tuner.

8. The reception device according to claim 6, wherein, if the second input terminal and the connection terminal are in a connection state, the reception device functions as a 1-input module to which a mixed wave of a first television signal and a second television signal received from the first input terminal is input.

9. The reception device according to claim 8, wherein a filter which passes and supplies the signal of the first frequency band to the first tuner is included at an input side of the first tuner.

10. The reception device according to claim 1, wherein:
the first connection portion includes a first switch for switching a connection state and a non-connection state between the first input terminal and the first circuit terminal of the matching unit,
the second connection portion includes a second switch for switching a connection of an input portion of the second tuner to the second input terminal or to the second circuit terminal of the matching unit, and
an input portion of the first tuner is connected to the first input terminal.

11. The reception device according to claim 10, wherein, if the first input terminal and the first circuit terminal of the matching unit are in the non-connection state through the first switch and the input portion of the second tuner and the second input terminal are in a connection state through the second switch, the reception device functions as a 2-input module in which a first television signal received from the first input terminal is input to the first tuner and a second television signal received from the second input terminal is input to the second tuner.

12. The reception device according to claim 10, wherein, if the first input terminal and the first circuit terminal of the matching unit are in the connection state through the first switch and the input portion of the second tuner and the second circuit terminal are in the connection state through the second switch, the reception device functions as a 1-input module to which a mixed wave of a first television signal and a second television signal received from the first input terminal is input.

13. The reception device according to claim 12, wherein a filter which passes and supplies the signal of the first frequency band to the first tuner is included at an input side of the first tuner.

14. The reception device according to any one of claims 10 to 13, further comprising a control unit configured to control switching of the first switch and the second switch.

15. The reception device according to claim 14, wherein the control unit has a function for switching the first switch and the second switch to perform a 1-input module function and a 2-input module function and scanning processed signals of the first tuner and the second tuner so as to monitor a reception state of the first television broadcast signal and the second television broadcast signal.

16. The reception device of claim 1, further comprising at least one LC filter coupled between the first input terminal and the first tuner.

17. The reception device of claim 16, further comprising:
a first switch connected between the first input terminal and the first circuit terminal of the matching unit; and a second switch connected between the second circuit terminal of the matching unit and the second tuner, wherein the first and second switches are controlled by a processor.

18. The reception device of claim 16, wherein the first tuner comprises a first voltage-controlled oscillator configured to oscillate in a first frequency range from 2150 MHz to 4300 MHz, and the second tuner comprises a second voltage-controlled oscillator configured to oscillate in a second frequency range from 1800 MHz to 3600 MHz.

19. The reception device of claim 18, wherein the first tuner further comprises a first crystal oscillator and the first tuner is configured to demodulate satellite broadcast signals in a frequency band from 950 MHz to 2150 MHz, and the second tuner further comprises a second crystal oscillator and the second tuner is configured to demodulate terrestrial broadcast signals in a frequency band from 40 MHz to 864 MHz.

20. The reception device of claim 1, wherein the first input terminal, the second input terminal, the matching unit, the first tuner, the second tuner, the first connection portion, and the second connection portion are formed as one semiconductor integrated circuit.

\* \* \* \* \*